United States Patent
Yuan (10) Patent No.: US 10,655,804 B1
(45) Date of Patent: May 19, 2020

(54) FLEXIBLE LED DEVICE WITH WHOLE BODY ILLUMINATION

(71) Applicant: LEDMY Shenzhen Co. Ltd., Futian, Shenzhen (CN)

(72) Inventor: Ling Yuan, Shenzhen (CN)

(73) Assignee: LEDMY Shenzhen Co. Ltd., Shenzhen (CN)

(*) Notice: Subject to any disclaimer, the term of this patent is extended or adjusted under 35 U.S.C. 154(b) by 0 days.

(21) Appl. No.: 16/350,848

(22) Filed: Jan. 23, 2019

(51) Int. Cl.
| | |
|---|---|
| *F21S 4/22* | (2016.01) |
| *G02B 5/02* | (2006.01) |
| *F21V 23/00* | (2015.01) |
| *H05K 1/18* | (2006.01) |
| *H05K 1/02* | (2006.01) |
| *F21V 3/04* | (2018.01) |
| *F21V 5/00* | (2018.01) |

(52) U.S. Cl.
CPC ............... *F21S 4/22* (2016.01); *F21V 3/049* (2013.01); *F21V 5/005* (2013.01); *F21V 5/008* (2013.01); *F21V 23/002* (2013.01); *G02B 5/0273* (2013.01); *H05K 1/0274* (2013.01); *H05K 1/189* (2013.01)

(58) Field of Classification Search
CPC ....... F21S 4/22; F21S 4/24; F21S 4/26; F21V 23/002; F21V 3/049; F21V 5/005; F21V 5/008; G02B 5/0273; H05K 1/0274; H05K 1/189

See application file for complete search history.

(56) References Cited

U.S. PATENT DOCUMENTS

| | | | | |
|---|---|---|---|---|
| 5,876,427 A | * | 3/1999 | Chen | A61N 5/0601 257/E25.021 |
| 8,721,113 B2 | * | 5/2014 | Lai | F21V 5/002 362/217.02 |
| 2005/0207156 A1 | * | 9/2005 | Wang | F21K 9/00 362/240 |
| 2005/0286260 A1 | * | 12/2005 | Liu | F21S 4/26 362/551 |
| 2015/0117001 A1 | * | 4/2015 | Fan | F21V 23/001 362/235 |
| 2016/0234940 A1 | * | 8/2016 | Shaytan | F21S 4/26 |
| 2018/0135812 A1 | * | 5/2018 | Gommans | F21K 9/27 |

\* cited by examiner

*Primary Examiner* — Alan B Cariaso

(74) *Attorney, Agent, or Firm* — James A. Gavney, Jr.; JAG Patent Services (57) ABSTRACT

A flexible LED lighting device is disclosed that includes a flexible LED light bar surrounded by a flexible conduit. The flexible LED light bar fits within a inner channel of the flexible conduit in an elongated direction and includes sets of LED arrays on opposed sides of a flexible elongate circuit board formed from a continuous wire band and circuit board segments. Preferably, the flexible conduit includes a tubular outer sleeve that surrounds a tubular inner sleeve and the tubular inner sleeve and LED light bar are cable of being displaced in a radial directions relative to the outer sleeve or in directions that are substantially orthogonal to the elongated direction. The flexible conduit is translucent and/or patterned to diffuse or scatter light emitted from the LED light bar to provide full-body illumination.

15 Claims, 7 Drawing Sheets

FLEXIBLE LED DEVICE WITH WHOLE BODY ILLUMINATION

RELATED APPLICATION

This application claims priority under 35 U.S.C. § 119 from the Chinese Patent Application No. 201811401653.5, filed Nov. 23, 20118 and the Chinese Patent Application No. 201821934137.4, filed Nov. 23, 20118. The Chinese Patent Application No. 201811401653.5, filed Nov. 23, 20118 and the Chinese Patent Application No. 201821934137.4, filed Nov. 23, 20118 are both hereby incorporated by reference.

FIELD OF THE INVENTION

This invention relates to the field of LED lighting technology. In particular this invention relates to flexible LED lighting devices.

BACKGROUND OF THE INVENTION

Flexible elongated lighting strips with LED arrays or LED light strips have been used for a number of adaptable lighting applications including display lighting, edge or corner lighting and decorative lighting. There are a number of shortcomings with the currently available LED strip light.

Many of the LED strip lights include flexible circuit boards with LEDs mounted to a flattened surface. In some of these LED strip lights, the flexible circuit boards are only flexible in two directions, much like a flattened strip of metal, and are subject to damage when they are bent or twisted in other directions as a result of torsional stresses along the thickness directions.

Other LED strip lights have individual LEDs mounted onto sets of laminated wires. While such wire mounted LED strip lights do allow for more flexibility, making such LED strip lights with larger LEDs is prohibitive because the wires do not provide a stable support for the larger LEDs. Further, with these wire mounted LED strip lights, each LED must be individually soldered or connected to the wires, thereby making a wire mounted LED strip light labor intensive to produce.

SUMMARY OF INVENTION

The present invention is directed to flexible light emitting diode (LED) lighting device, hereafter LED lighting device. The LED lighting device preferably provides for full-body illumination around an elongated body structure. The LED lighting device includes LED arrays. The LED arrays have any number of LEDs and any color or combination of LED colors. The LED lighting device can include any circuitry required to initiate operational sequences, for tuning brightness, and/or tuning color of light emitted from the LED arrays. The LED lighting device of the present invention can also be configured for linking to, or connecting electrically to, other similar LED lighting devices. Because the LED lighting device is intended for extended lighting application, each LED lighting device preferably includes 50 or more individual LEDs.

The LED lighting device includes an elongated light bar that preferably includes sets of LED arrays that are positioned along at least two opposed and flattened sides along a flexible elongate circuit board in an elongated direction. The elongated flexible circuit board is preferably formed from a continuous flexible wile band with the necessary direct current wire construction to power the LED arrays coupled thereto. For example, the flexible wire band includes braided wire sets that are laminated within a polymeric insulating material or materials with electrical end connections for connecting the LED lighting device to a power source. In accordance with the embodiments of the invention, the flexible elongated circuit board also includes circuit board segments that are separated by segments of the continuous flexible wire band. The circuit board segments are in electrical communication with the wires of the continuous flexible wire band and preferably sandwich portions thereof. The circuit board segments support sets of opposed LED arrays and provide the electrically connectivity between the LED arrays and the wires of the continuous flexible wire band. The unoccupied segments of the continuous flexible wire band between the circuit board segments act as living hinges and allow for greater flexibility of the elongated light bar.

The LED lighting device also includes a flexible conduit. The flexible conduit surrounds the flexible LED light bar described above. The flexible conduit is preferably made of one or more polymeric plastic or rubber materials. The flexible conduit can be transparent, translucent or any combination thereof, but preferably diffuses light that is emitted from the flexible LED light bar. The flexible conduit is preferably tubular having a substantially circular cross-sectional shape and an inner channel with a substantially circular cross-sectional shape. However, other cross-sectional shapes for both the flexible conduit and the inner channel are envisioned. Other cross-sectional shapes include, but are not limited to, triangular, square, star or irregular cross-sectional shapes. Regardless of the cross-sectional shape of the flexible conduit or the inner channel, the inner channel extends through the flexible conduit body in an elongated direction.

In operation, the flexible LED light bar is positioned within the inner channel or the flexible conduit and extends through the inner channel of the flexible conduit. With the flexible light bar energized, the flexible LED light bar emits light from the inner walls of the flexible conduit through the body of the flexible conduit to provide full-body illumination around the length of the LED lighting device. The flexible LED light bar is preferably sized such that the flexible LED light bar is capable or moving or twisting within the inner channel of the flexible conduit in directions that are substantially orthogonal to the elongated direction of the channel.

In accordance with the embodiments of the invention, inner walls (surfaces) of the inner channel of the flexible conduit are patterned to diffuse or scatter light emitted from the flexible LED light bar positioned therein. For example, the inner walls of the inner channel are patterned with protrusions, recesses, and/or depressions that extend continuously along the inner walls of the inner channel in the elongated direction.

In yet further embodiments of the invention, the flexible conduit comprises an outer sleeve with an outer sleeve channel extending in the elongated direction and a inner sleeve with an inner sleeve channel extending in the elongated direction. In operation, the inner sleeve fits within the outer sleeve channel and the inner sleeve is capable of twisting within the outer sleeve channel in directions that are substantially orthogonal to the elongated direction. In addition to the patterning described above, or independent of the patterning described above, inner walls of the outer sleeve channel can be patterned to help diffuse or scatter light emitted from the flexible LED light bar positioned within the inner sleeve channel.

It will be clear to one skilled in the art that the particular materials used to make the flexible conduit and the optical configurations employed can be altered without departing from the scope of the invention. For example, one or both of the inner sleeve and/or the outer sleeve of flexible conduit described above can include materials that are transparent, translucent or any combination thereof. Further, in addition to, or alternatively to, the inner walls of the inner sleeve or outer sleeve being patterned, the outer walls or surfaces of one or more of inner sleeve or outer sleeve can also be patterned to diffuse or scatter light emitted from the flexible LED light bar surrounded by the flexible conduit. In accordance with a particular embodiment of the invention, the inner sleeve of the flexible conduit is formed form a transparent polymer while the outer sleeve of flexible conduit is formed from a milky translucent polymer.

DETAILED DESCRIPTION OF THE INVENTION

Figure 1A:
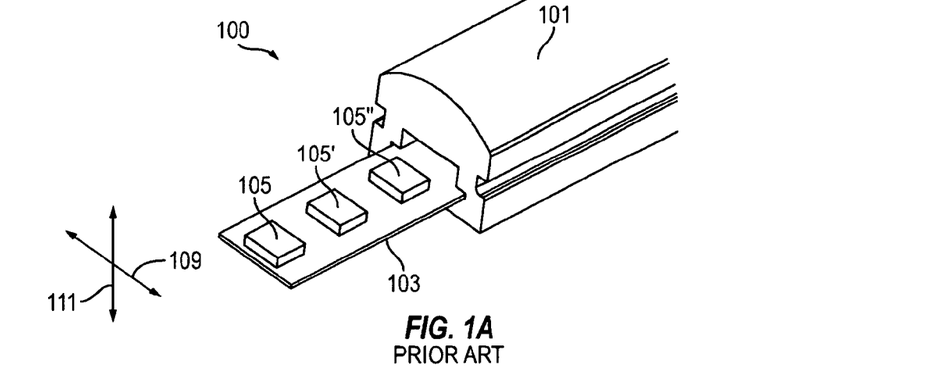
FIGS. 1A-C are illustrations of a prior art—a flexible light emitting diode (LED) lighting device.
Figure 1B:
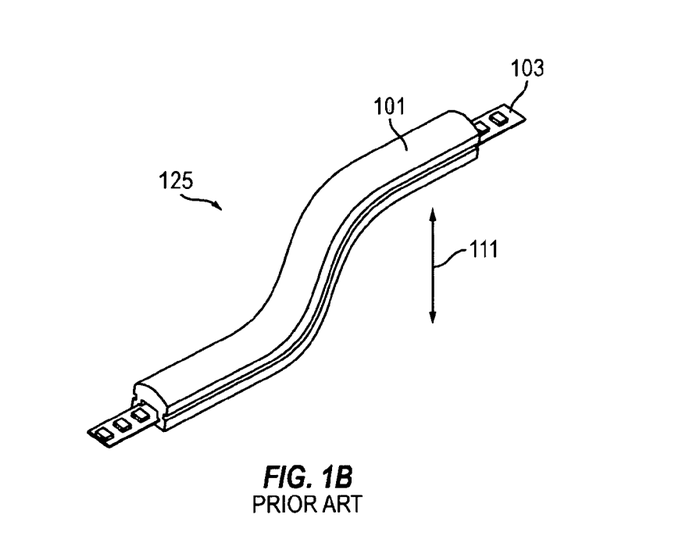
Figure 1C:
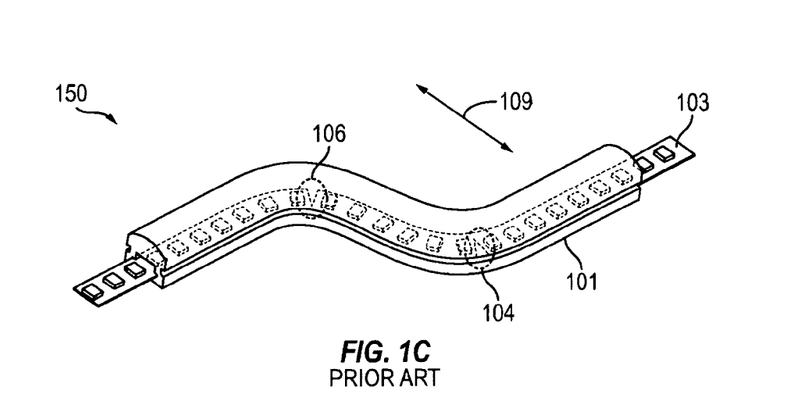

The flexible light emitting diode (LED) lighting devices, or flexible LED lighting devices have lengths in an elongated direction that are typically several times greater (20 times greater) than their respective widths. Referring to FIGS. 1A-C, a prior art flexible LED lighting device 100 is formed from a flexible circuit board 103 with LED lamp beads 105, 105' and 105" that are mounted thereto. The flexible circuit board 103 and the LED lamp beads 105, 105' and 105" are tightly wrapped, or embedded, within a flexible plastic or rubber body structure 101. The flexible light LED lighting device 100 is flexible in directions 111 that are substantially perpendicular to flattened surfaces of the flexible circuit board 103, as illustrated by 125. However, the flexible LED lighting device 100 is not capable of bending to any great degree in directions 109 that are parallel to the flattened surfaces of the flexible circuit board 103 or twisting rotationally in directions that are orthogonal to the elongated direction of the flexible light LED lighting device 100. Bending or twisting the flexible LED lighting device 100 as described causes torsional stresses along thickness directions of the flexible circuit board 103 and can cause the flexible circuit board 103 to be damaged or break at or near stress regions 104 and 106, as illustrated by 150. Also, the flexible light LED lighting device 100 does not provide full body illumination and only emits light from the LED lamp beads 105, 105' and 105" on one side of the flexible circuit board 103.

Figure 2A:
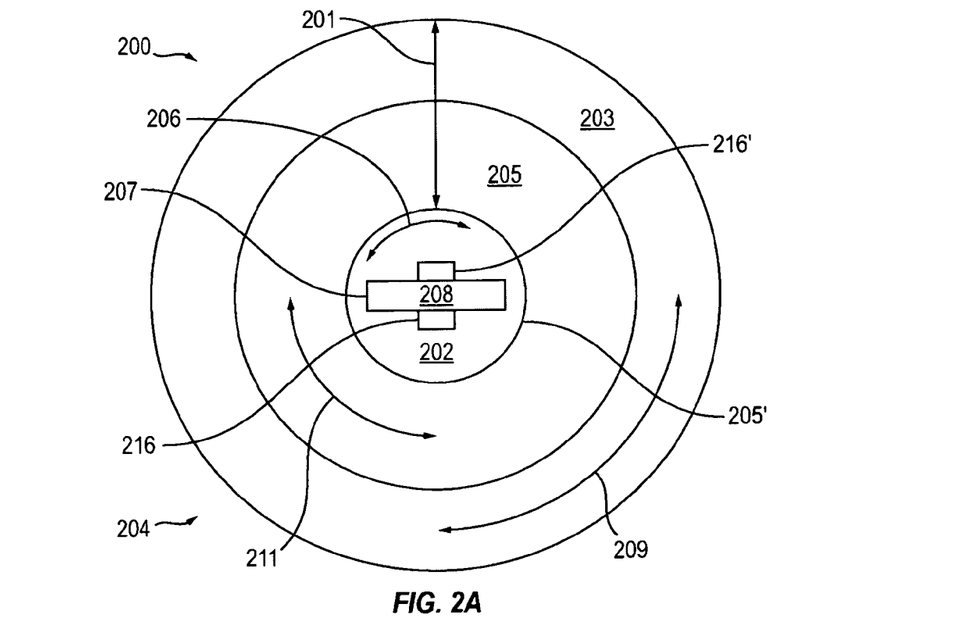
FIG. 2A-B show cross-sectional views of a flexible light emitting diode (LED) lighting device, in accordance with the embodiments of the present invention.

FIG. 2A shows a cross-sectional view 200 of flexible LED lighting device, in accordance with the embodiments of the invention. In order to address the aforementioned flexibility shortcomings and to provide full body illumination, the flexible LED lighting device includes an elongated flexible LED light bar 207, hereafter flexible LED light bar, with LED arrays 216 and 216' positioned on opposed sides of an elongated flexible circuit board 208, hereafter flexible circuit board. The flexible LED light bar 207 is positioned within an inner channel 202 of an elongated flexible conduit body 204, hereafter, flexible conduit. The flexible LED light bar 207 is preferably loosely positioned within the inner channel 202 of the flexible conduit, such that the flexible LED light bar 207 is not wedged against inner walls 205' of the inner channel 202 and is, therefore, capable of moving, rotating and/or twisting within the inner channel 202, as indicated by the arrow 206. The inner channel 202 can be filled with a stabilizing material, such as a viscous material, a gel material, or powder material to stabilize the position of the flexible LED light bar 207 within the inner channel 202.

Still referring to FIG. 2A, the flexible conduit 204 and the inner channel 202 are shown here as being tubular, having substantially circular cross-sectional shapes, however, other cross-sectional shapes for both the flexible conduit 204 and the inner channel 202 are envisioned. Other cross-sectional shapes included, but are not limited to, triangular, square, star, or irregular cross-sectional shapes. Regardless, of the cross-sectional shapes of the flexible conduit 204 or the inner channel 202, the inner channel 202 extends through the flexible conduit 204 in an elongated direction.

In further embodiments of the invention, the flexible conduit 204 is formed from an inner sleeve 205 surrounded by an outer sleeve 203. In operation, the inner sleeve 205 and the outer sleeve 203 are preferably capable of moving or rotating relative to each other, as indicated by the arrows 211 and 209, thus further enhancing the flexibility of the LED lighting device of the present invention by reducing torsional strains while bending or twisting the LED lighting device. The inner sleeve 205 and the outer sleeve 203 are preferably made of one or more polymeric plastic or rubber materials. The inner sleeve 205 and the outer sleeve 203 can be transparent, translucent or a combination thereof, but preferably the flexible conduit 204 diffuses or scatters light that is emitted from the flexible LED light bar 207 through the body of flexible conduit, as indicted by the arrow 201. Preferably, the inner sleeve 205 is formed from a transparent or clear polymer and the outer sleeve 203 is formed form a translucent or milky polymer.

Figure 2B:
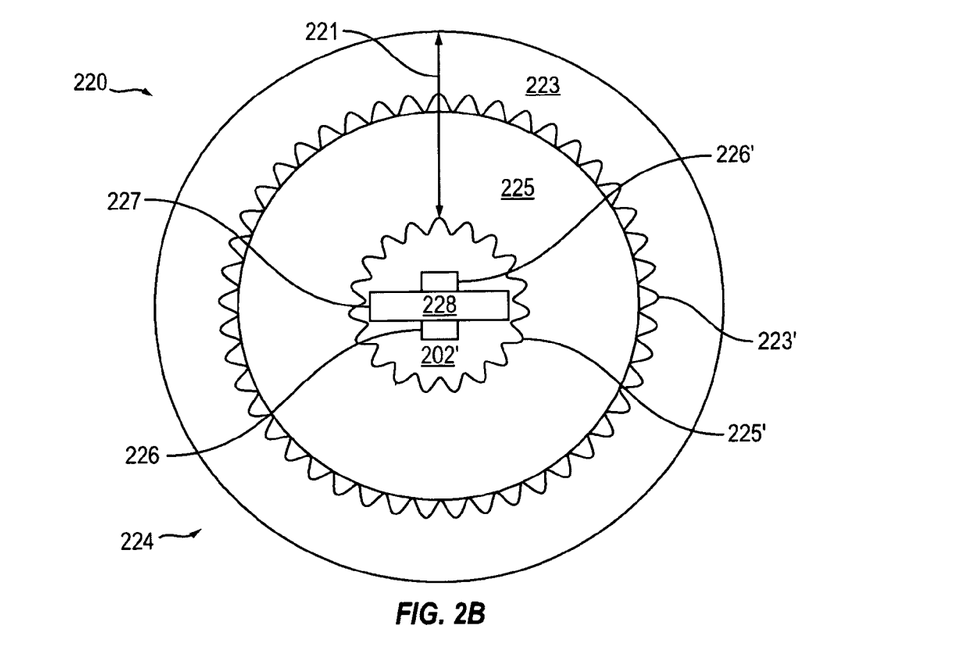

FIG. 2B shows a cross-sectional view 220 of flexible LED lighting device, in accordance with further embodiments of the invention. As described above, the LED lighting device includes a flexible light bar 227, with LED arrays 226 and 226' positioned on opposed sides of a flexible circuit board 228. The flexible LED light bar 227 is positioned within an inner channel 202' of a flexible conduit 224.

The flexible conduit 224 is formed from an inner sleeve 225 surrounded by an outer sleeve 223. Preferably, the inner sleeve 205 is formed from a transparent or clear polymer and the outer sleeve 223 is formed from a translucent or milky polymer. In operation, the flexible LED light bar 227 is capable of moving, rotating and/or twisting within the inner channel 202', and the inner sleeve 225 and the outer sleeve 223 are capable of moving or rotating relative to each other, such as described above with reference to FIG. 2A.

In accordance with this embodiments of the invention, walls 225' (inner walls) of the inner sleeve 225 and/or walls 223' (inner walls) of the outer sleeve 223 of the flexible conduit 224 are patterned to diffuse or scatter light emitted from the flexible LED light bar 227 positioned with the inner channel 202'. For example the walls 225' and/or 223' are patterned with protrusions, recesses, and/or depressions that extend continuously along the walls 223' and 225' in the elongated direction of the flexible conduit 224 to help diffuse or scatter light that is emitted from the flexible LED light bar 227 through the body of the flexible conduit 224, as indicated by the arrow 221.

Figure 3:
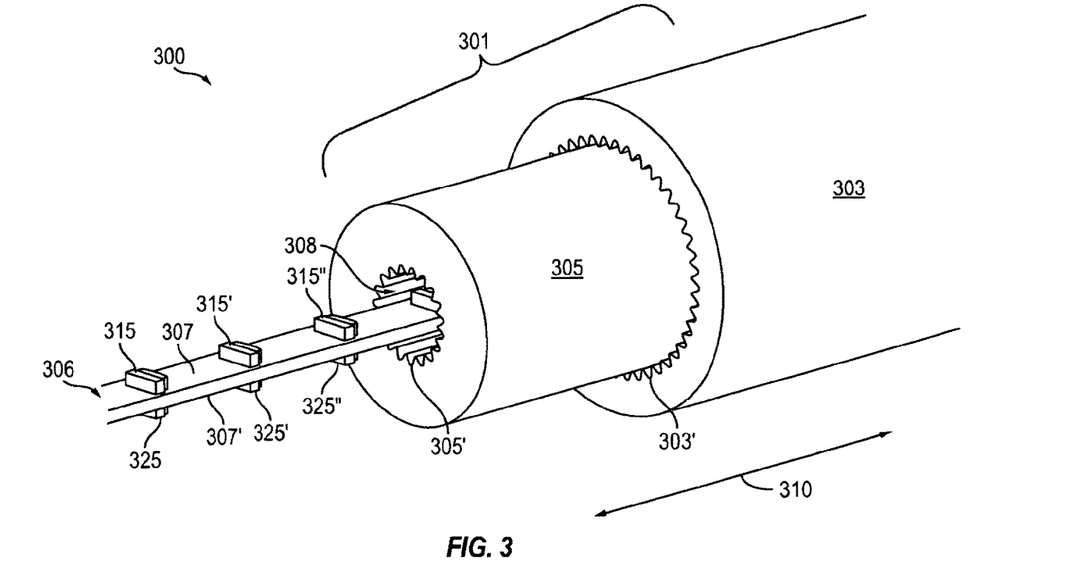
FIG. 3 shows a perspective view of a portion of a flexible light emitting diode (LED) lighting device with LEDs mounted on opposed sides of a LED light bar, in accordance with the embodiments of the present invention.

FIG. 3 shows a perspective view of a portion 300 of a flexible LED lighting device with LED arrays 315, 315', 315" and 325, 325', 325' mounted on opposed sides 307 and 307' of an elongated and flexible LED light bar 306. As described above, the flexible LED light bar 306 is positioned within an inner channel 308 and surrounded by a elongated and flexible conduit 301. The flexible conduit 301 is formed from an inner sleeve 305 surrounded by an outer sleeve 303 with patterned walls or surfaces 305' and 303' that include protrusions, recesses and/or depressions extending through the flexible conduit in an elongated direction 310.

Figure 4:
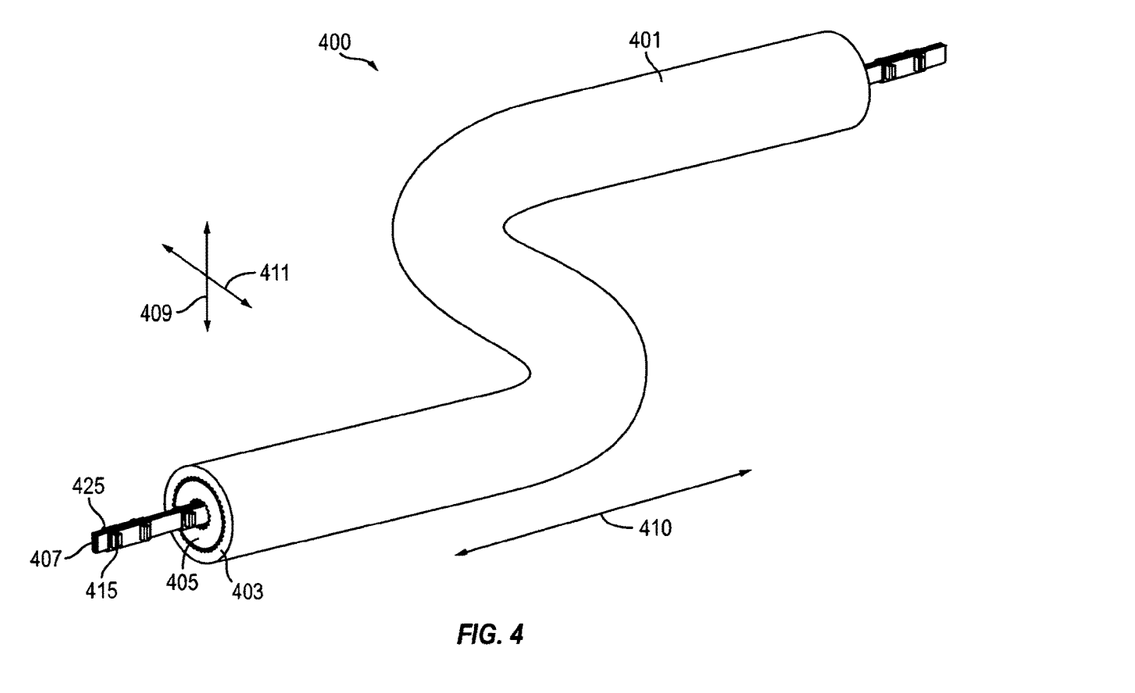
FIG. 4 shows a perspective view of a portion of a flexible light emitting diode (LED) lighting device being flexed or bent in several directions.

FIG. 4 shows a portion 400 of a flexible LED lighting device with LED arrays 415 and 425 mounted on opposed sides of flexible LED light bar 407, similar to that described above with reference to FIG. 3. The LED light bar 407 is surrounded by a flexible conduit 401 formed form an inner sleeve 405 surrounded by an outer sleeve 403. The portion 400 of a flexible LED lighting device is capable of being bent or twisted in any number of directions including, but not limited to, directions that are substantially orthogonal to an elongated direction 410, as indicated by the arrows 409 and 411.

Figure 5A:
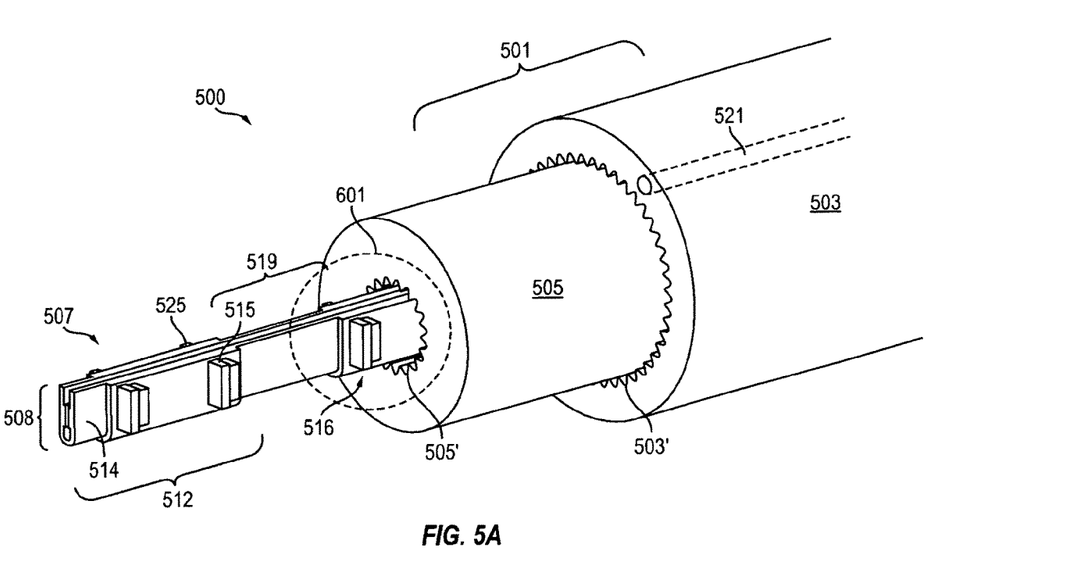
FIG. 5A shows a perspective view of a portion of a flexible light emitting diode (LED) lighting device with LEDs mounted on opposed sides of circuit board segments separated by portions of a flexible wire band, in accordance with the embodiments of the present invention.
Figure 5B:
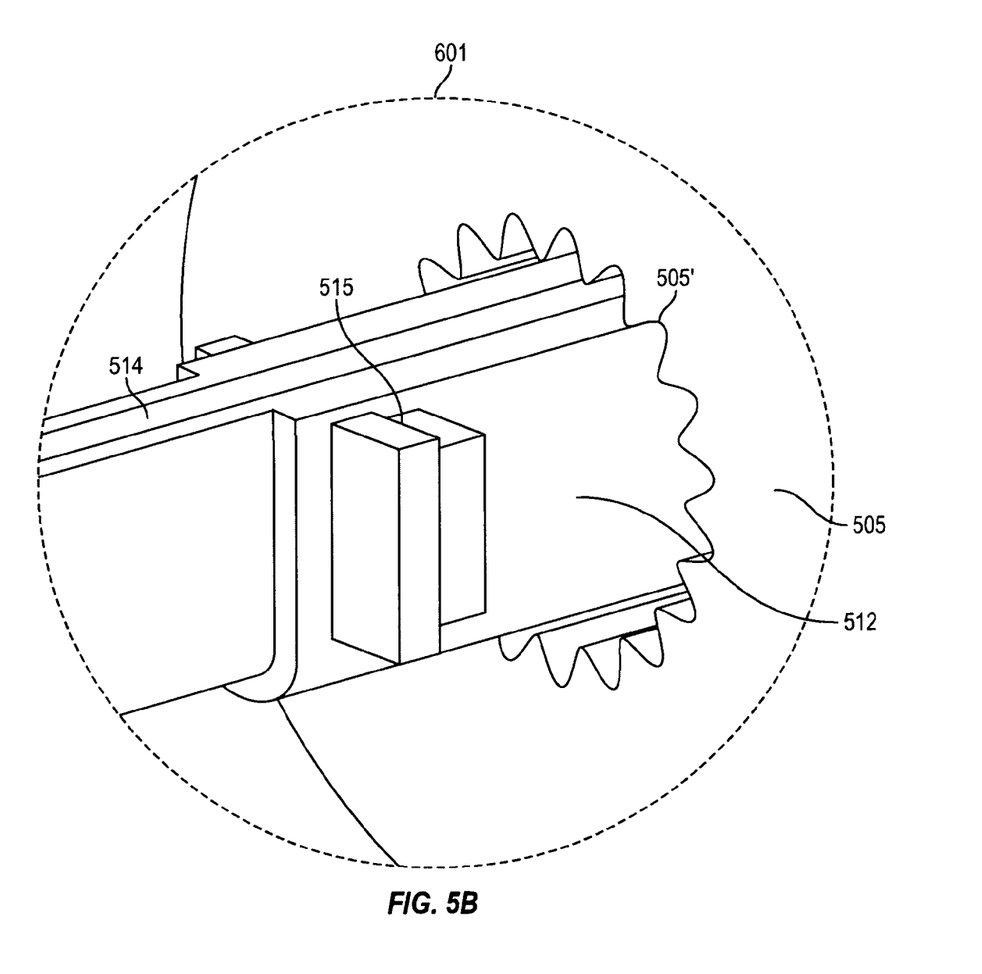
FIG. 5B shows a detailed view of a portion of an LED light bar shown in FIG. 5A positioned within an inner channel of a flexible conduit, in accordance with the embodiments of the present invention.
Figure 5C:
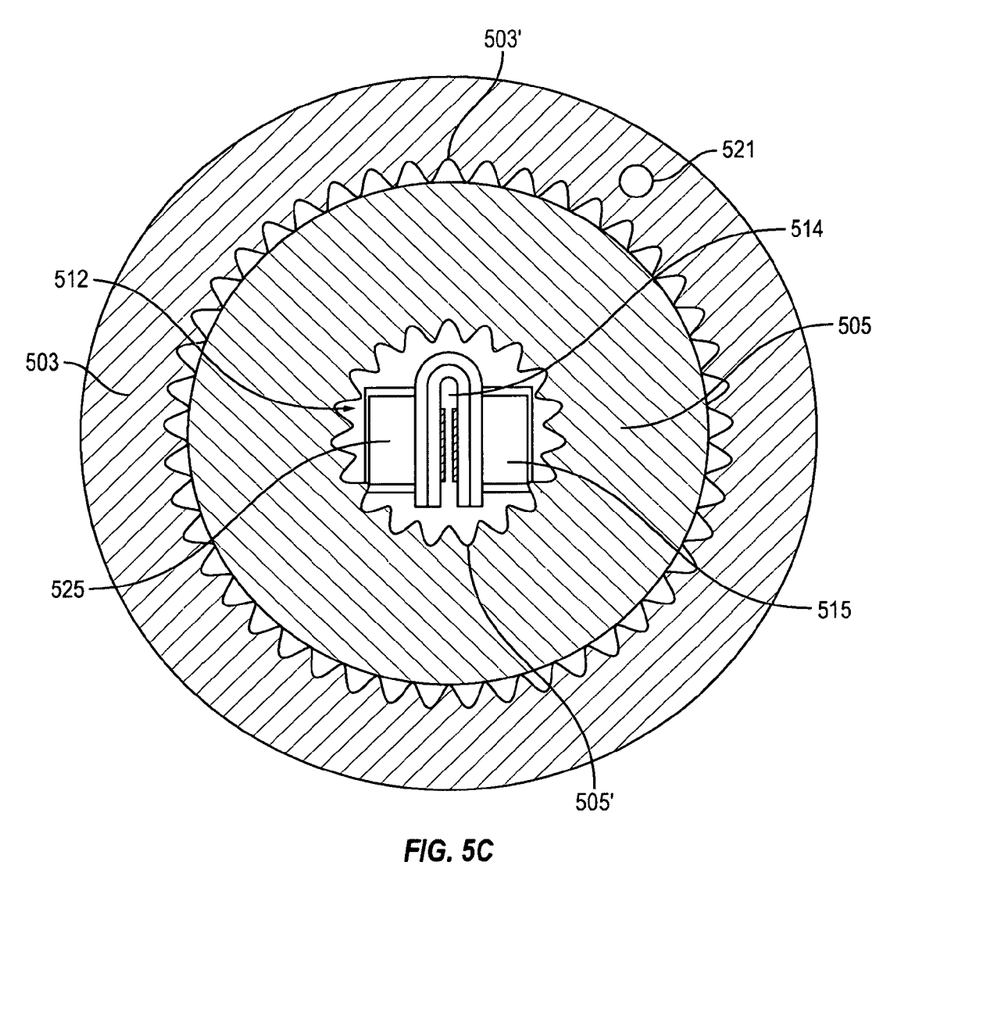
FIG. 5C shows a cross-sectional view of a portion of a flexible light emitting diode (LED) lighting device shown in FIG. 5 and FIG. 6.

Referring now to FIGS. 5A-C, in a preferred embodiment of the invention, a flexible LED lighting device 500 includes an elongated and flexible LED light bar 507 that is surrounded by a elongated and flexible conduit 501 formed from an inner sleeve 505 and an outer sleeve 503 with patterned walls of surfaces 505' and 503', such as described above. In accordance with this embodiment of the invention, the flexible LED light bar 507 includes sets of LED arrays 515 and 525 that are positioned along at least two opposed and flattened sides along the flexible circuit board 508. The flexible circuit board 508 is preferably formed from a continuous flexible wire band 514 with the necessary direct current wire construction to power the sets of opposed LED arrays 515 and 525 attached thereto. For example, the continuous flexible wire band 514 includes braided wire sets that are laminated within a polymeric insulating material or materials with electrical end connections (not shown) for connecting the LED lighting device 500 to a power source.

In accordance with this embodiments of the invention, the flexible circuit board 508 also includes circuit board segments 512 and 516 that are separated by segments 519 of the continuous flexible wire band 514. The circuit board segments 512 and 516 are in electrical communication with the wires embedded within the continuous flexible wire band 514 and preferably sandwich portions of the continuous flexible wire band 514. The circuit board segments 512 and 516 support the sets of opposed LED arrays 515 and 525 and provide the electrically connectivity between the opposed LED arrays 515 and 525 and the wires of the continuous flexible wire band 514. The segments 519 of the continuous flexible wire band 514, positioned between the circuit board segments 512 and 516, can act as living hinges and allow for greater flexibility of the elongated light bar 507.

The construction of the "double sided" LED light bar 507 describe and shown in FIGS. 5A-C is preferred to the double sided light bar 306 shown in FIG. 3 for several reason. Continuous circuit boards used to make the double side LED light bar 306 is less flexible than the circuit board segments 512 and 516 and continuous flexible wire band 514 used to make the doubled side LED light bar 507. Further, there are limitations on how long of a flexible LED light fixture can be made with the double sided LED light bar 306 because there are limitations on the length that a continuous circuit board can be made. On the other hand, making a flexible LED light fixture with the double sided LED light bar 507 is not limited to a particular length, since continuous flexible wire bands, such as 514, with any number of circuit board segments, such as 512 and 516, are easily produced.

Referring to FIG. 5-B, the regions 601 shows additional details of one of the circuit board segments 513 sandwiching a portion of the continuous flexible wire band 514. There are a number of methods envisioned for making flexible LED light bar 507 used in the flexible LED lighting device of the present invention. For example, a continuous flexible wire band 514 can be formed to have single polarity (positive or negative) wires on each side, alternatively, each side can be formed to have two polarity (positive and negative) wire sets. Regardless, the circuit boards segments, such as 512 and 516, can be made to be flexible with contact leads on bottom surfaces and with LED arrays 515 and 525 attached to top surfaces. The circuit board segments can then be folded over portions of the continuous flexible wire band 514 to sandwich portions of the continuous flexible wire band 514, as shown in FIGS. 5B-C. The folded circuit board segments 512 and 516 can then be pressed or soldered to force or place the contact leads on the bottom surfaces in electrical contact with the appropriate wires on the continuous flexible wire band 514. Standard techniques, such as using steel mesh brush and applying a solder paste to the bottom surfaces of the flexible circuit board segment 512 and 516 to thereby automatically solder the folded flexible circuit boards 512 and 516 to the continuous flexible wire band 514 by "reflow soldering" can be employed. Once the electrical contacts are made, portions of the continuous flexible wire band 514 and/or portions flexible circuit board segments 512 and 516 can be coated with an insulating epoxy or glue.

The flexible LED lighting device of the present invention can also include a metal wire or metal bar 521 extending through the flexible conduit 510. The metal wire or metal bar 521 can be embedded within the inner sleeve 505 or the outer sleeve 503 of the flexible conduit 501. In operation the flexible LED lighting device is bent or formed into a desired shape and the metal wire or metal bar 521 helps to hold the flexible LED lighting device in the desired shape.

The present invention provided for a flexible LED lighting device with full body illumination. The invention has been described in terms of specific embodiments incorporating details to facilitate the understanding of the principles of construction and operation of the invention. As such, references herein to specific embodiments and details thereof are not intended to limit the scope of the claims appended hereto. It will be apparent to those skilled in the art that modifications can be made in the embodiments chosen for illustration without departing from the spirit and scope of the invention.

What is claimed is:

1. A flexible LED lighting device comprising:
   a) a flexible light bar extending in an elongated direction formed from a flexible circuit board having opposed linear LED arrays extending in the elongated direction and located along opposed sides of the flexible circuit board; and
   b) a flexible translucent conduit with a channel passing through the flexible translucent conduit in the elongated direction, wherein the flexible light bar fits within the channel of the flexible translucent conduit such that inner walls of the flexible translucent conduit surround the flexible light bar and the flexible light bar is capable of twisting or turning within the channel of the flexible translucent conduit, wherein the flexible translucent conduit comprising an inner sleeve and an outer sleeve with a channel passing through the outer sleeve in the elongated direction with inner walls that surround the inner sleeve, wherein the inner sleeve is capable of twisting within in the channel of the outer sleeve and wherein an inner walls of the outer sleeve are patterned with protrusions, recesses, and/or depressions that diffuse light emitted from the flexible light bar.

2. The flexible LED lighting device of claim 1, wherein inner walls of the flexible translucent conduit are patterned with protrusions, recesses, and/or depressions that diffuse light emitted from the flexible light bar within the channel of the flexible translucent conduit.

3. The flexible LED lighting device of claim 2, wherein the protrusions, recesses, and/or depressions on inner walls of the flexible translucent conduit extend continuously in the elongated direction.

4. The flexible LED lighting device of claim 1, wherein the flexible circuit board comprises a continuous flexible wire band and circuit board segments that are in electrical communication with the flexible wire band and sandwich portions of the flexible wire band.

5. The flexible LED lighting device of claim 1, wherein the protrusions, recesses, and/or depressions on the inner walls of the outer sleeve extend continuously in the elongated direction.

6. The flexible LED lighting device of claim 1, wherein the opposed linear LED arrays comprise 50 or more LEDs.

7. A flexible LED lighting device comprising: a) a flexible conduit comprising a translucent outer sleeve with an outer sleeve channel extending in an elongated direction and a transparent inner sleeve with an inner sleeve channel extending in the elongated direction, wherein the transparent inner sleeve fits within the outer sleeve channel and wherein the transparent inner sleeve is capable or twisting within the outer sleeve channel in a direction that is substantially orthogonal to the elongated direction; and b) a flexible LED light bar extending in the elongated direction and positioned within the inner sleeve channel, wherein inner walls of both of the translucent outer sleeve channel and transparent inner sleeve channel are patterned with protrusions, recesses, and/or depressions that diffuse light emitted from the flexible LED light bar.

8. The flexible LED lighting device of claim 7, wherein the flexible LED light bar is formed from a flexible circuit board having opposed sets of linear LED arrays extending in the elongated direction and located along opposed sides of the flexible circuit board.

9. The flexible LED lighting device of claim 8, wherein the flexible circuit board comprises a continuous flexible wire band and circuit board segments that are in electrical communication with the flexible wire band and sandwich portions of the flexible wire band.

10. The flexible LED lighting device of claim 8, wherein the opposed linear LED arrays comprise 50 or more LEDs.

11. The flexible LED lighting device of claim 7, wherein the flexible LED light bar is capable of twisting within the inner sleeve channel in a direction that is substantially orthogonal to the elongated direction.

12. The flexible LED lighting device of claim 7, wherein the protrusions, recesses, and/or depressions on the inner walls extend continuously in the elongated direction.

13. A flexible LED lighting device comprising:
   a) a flexible translucent conduit comprising an elongated tubular outer sleeve that surrounds a elongated tubular inner sleeve; and
   b) an elongated flexible LED light bar that is surrounded by the elongated tubular inner sleeve, wherein the elongated flexible LED light bar is capable of twisting within a channel of the elongated tubular inner sleeve in a direction that is substantially orthogonal to the channel, wherein an inner wall of the elongated tubular outer sleeve has patterns to scatter or diffuse light emitted form the elongated flexible LED light bar that extends continuously along the inner wall of the elongated tubular outer sleeve.

14. The flexible LED lighting device of claim 13, wherein the elongated flexible LED light bar is formed from a flexible circuit board having two opposed linear LED arrays extending in an elongated direction and located along opposed sides of the flexible circuit board.

15. The flexible LED lighting device of claim 14, wherein the flexible circuit board comprises a continuous flexible wire band and circuit board segments that are in electrical communication with the flexible wire band and sandwich portions of the flexible wire band.

* * * * *